United States Patent [19]
Edel et al.

[11] 3,982,974
[45] Sept. 28, 1976

[54] COMPENSATION OF AUTODOPING IN THE MANUFACTURE OF INTEGRATED CIRCUITS

[75] Inventors: William A. Edel, Poughkeepsie; Joseph Regh, Wappingers Falls, both of N.Y.

[73] Assignee: International Business Machines Corporation, Armonk, N.Y.

[22] Filed: Dec. 24, 1974

[21] Appl. No.: 536,050

Related U.S. Application Data

[63] Continuation of Ser. No. 201,024, Nov. 22, 1971, abandoned.

[52] U.S. Cl. .............................. 148/175; 148/191; 156/610; 156/612; 357/48; 357/89; 357/90
[51] Int. Cl.² ................ H01L 21/205; H01L 21/22
[58] Field of Search ............ 148/175, 191; 357/48, 357/89, 90; 156/610, 612

[56] References Cited
UNITED STATES PATENTS

| | | | |
|---|---|---|---|
| 3,328,213 | 6/1967 | Topas .............................. | 148/175 |
| 3,404,450 | 9/1968 | Karcher .......................... | 148/175 X |
| 3,660,180 | 5/1972 | Wajda ............................. | 148/175 |
| 3,716,422 | 2/1973 | Ing et al. ........................ | 148/175 |

OTHER PUBLICATIONS

Demsky et al., "Technique for Counteracting Epitaxial Autodoping," IBM Tech. Discl. Bull., vol. 13, No. 3, Aug. 1970, p. 807–808.
Runyan, W. R., "Silicon Semiconductor Technology," Textbook, McGraw–Hill, 1965, pp. 69–73.
Jackson, D. M., "Advanced Epitaxial Processes–Applications," Trans. Metall. Soc. of Aime, vol. 233, Mar. 1965, pp. 596–602.
Edel, W. A., "Stacking Fault Free Epitaxial Layers," IBM Tech. Discl. Bull., vol. 14, No. 5, Oct. 1971, p. 1654.

*Primary Examiner*—L. Dewayne Rutledge
*Assistant Examiner*—W. G. Saba
*Attorney, Agent, or Firm*—Thomas F. Galvin

[57] ABSTRACT

A method of making an integrated circuit wherein a subcollector diffusion mask is formed on a semiconductor wafer. A principal impurity of a predetermined conductivity type is then diffused through windows in the mask and into the wafer to form subcollector regions spaced from each other. A compensating impurity of a conductivity type opposite that of the principal impurity is then diffused through the same mask windows into the subcollector regions to a relatively shallow depth. An epitaxial layer is then grown on the wafer during which an amount of the principal impurity diffuses from the subcollector regions into the gas and then into the epitaxial layer and the wafer in areas thereof exterior to the peripheries of the subcollector regions thereby resulting in an autodoping effect. However, the compensating impurity simultaneously diffuses into the exterior areas so as to compensate approximately for the principal impurity and thereby to counteract the autodoping effect of the principal impurity.

21 Claims, 8 Drawing Figures

COMPENSATION OF AUTODOPING IN THE MANUFACTURE OF INTEGRATED CIRCUITS

This is a continuation, of application Ser No. 201,024 filed Nov. 22, 1971, now abandoned.

BACKGROUND OF THE INVENTION

1. Field of the Invention

This invention relates to the manufacture of integrated circuits; that is, to circuits formed by the diffusion of impurities into an epitaxial layer deposited upon a unitray monolithic semiconductor substrate. More particularly, the invention relates to a novel method of making integrated circuits which compensates for so-called "autodoping" during epitaxial deposition so as to counteract the inevitable and undesirable spread of doping impurities beyond the regions into which they are initially diffused.

2. Description of the Prior Art

The cost and performance of electronic apparatus composed of integrated circuits, such as modern digital computers, are greatly dependent upon two factors: (1) the circuit density or the number of circuits per unit of silicon area; and (2) the operating speed of the circuits.

Both of these factors depend in turn upon the minimum required spacing between adjacent transistors. That is, the closer the transistors are to each other, the smaller is the silicon area occupied per transistor and the higher is the circuit density. Furthermore, the smaller circuits result in shorter carrier conduction paths and hence higher circuit operating speeds.

A primary limitation on the permissible spacing between adjacent transistors of an integrated circuit is due to the effect known as "autodoping" which results in the migration of a doping impurity beyond the regions into which it is initially diffused.

For example, it is usual that each transistor be formed with a subcollector region buried beneath an epitaxial layer forming the collector region. To form this structure, a subcollector diffusion mask is first grown on the silicon wafer surface. The mask is provided with openings or windows delineating the subcollector areas. A doping impurity is then diffused through the mask windows and into the silicon wafer to form the doped subcollector regions. The mask is removed and an epitaxial layer is then grown over the wafer surface by subjecting the wafer to a high-temperature atmosphere containing silicon tetrachloride in a gaseous state. During this epitaxial growth step, the impurity previously diffused into the subcollector regions diffuses out of the latter and into the gas, spreads within the gas, and then diffuses into the growing epitaxial layer and also back into the wafer.

As a result, both the wafer and the epitaxial layer have the impurity diffused therein in areas which are exterior to the original peripheries of the subcollector regions so that these regions in effect have lateral extensions projecting a substantial distance toward the respective adjacent subcollector regions. If the adjacent transistors are not spaced sufficiently far apart, the autodoped lateral extensions of adjacent subcollector regions will meet and thereby short-circuit the collectors of adjacent transistors.

Therefore, the result of the autodoping effect is to impose upon the integrated circuit layout the requirement that the transistors be spaced from each other no closer than a certain minimum distance, thereby limiting the density and speed of the circuitry and degrading the cost-performance ratio of the apparatus.

Because of the importance of the autodoping effect, intensive efforts have been made in the prior art to solve the problem. One attempt was to deposit in the epitaxial layer a low concentration level impurity of a conductivity type opposite that of the principal impurity in the subcollector regions. That is, during the epitaxial growth step, the wafer was subjected to a gas containing the opposite type impurity in addition to the silicon tetrachloride and carrier gases. This impurity then deposited in the growing epitaxial layer so as to dope the latter and counteract the autodoping by the principal impurity. However, this prior art attempt proved unsuccessful, primarily because the resulting compensation was not proportional to the autodoping contamination by the principal impurity with respect to distance from the diffusion window edge.

Another prior art attempt to solve the autodoping problem involved lowering the deposition temperature to minimize outdiffusion of the impurity into the gas during the epitaxial deposition. Although this did reduce the autodoping effect somewhat, the process was not feasible because the resulting epitaxial layer had an excessive number of crystallographic effects.

SUMMARY OF THE INVENTION

It is therefore a primary object of the present invention to provide a solution to the autodoping problem whereby circuit density and speed may be increased so as to reduce the cost and improve the performance of digital computers and other apparatuses utilizing integrated circuits.

This object is achieved by compensating for the autodoping effect in the following manner. After the principal impurity is diffused through the mask windows and into the wafer, and prior to the epitaxial deposition, a compensating impurity of a conductivity type opposite that of the principal impurity is diffused through the same mask windows and into the subcollector regions to a relatively shallow depth. During the subsequent epitaxial deposition the compensating impurity diffuses out of the subcollector regions and into the gas and then diffuses into the growing epitaxial layer and back into the wafer, along with the principal impurity and throughout the same areas exterior to the mask window outlines and the original peripheries of the subcollector regions. The compensating impurity thereby compensates for and counteracts the effect of the autodoping of the principal impurity in these exterior areas, and the original outlines of the subcollector regions are substantially maintained.

Although the invention is disclosed as applying to an epitaxial deposition after a diffusion which forms a subcollector, it will be understood that this is merely for purposes of illustration and that the invention is applicable wherever autodoping results from successive diffusion and epitaxial deposition steps.

Another advantageous result of the present invention is the retention of the compensation of the impurities exterior to the peripheries of the subcollector windows during the subsequent oxidation and diffusion steps. After the epitaxial deposition, the isolation, base and emitter regions are formed by subsequent masking and diffusion steps during which the principal impurity of the subcollector region in the autodoped area tends to outdiffuse. However, the impurity which was diffused into the subcollector regions to compensate for auto-

3 doping will also outdiffuse along with the principal impurity to compensate for the outdiffusion of the latter.

DESCRIPTION OF THE PRIOR ART

Figure 1:
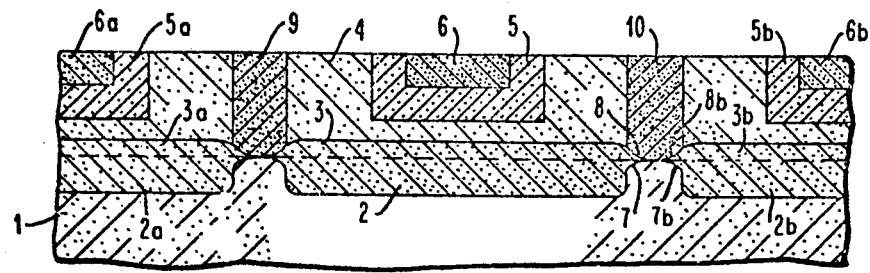
FIG. 1 is a sectional view showing three adjacent transistors of an integrated circuit constructed in accordance with the usual method of the prior art.

Referring to FIG. 1, there is shown an integrated circuit structure comprising three adjacent transistors made in accordance with the usual method of the prior art. The reference numeral designates the silicon wafer or substrate into which has been diffused an impurity forming the subcollector regions 2, 2a, 2b. An epitaxial layer 4 has been deposited over the upper surface of the substrate 1. The subcollector regions 2, 2a, 2b have outdiffused into the epitaxial layer 4, thereby forming the respective regions 3, 3a, 3b. The respective base regions 5, 5a, 5b of the three transistors have been diffused into the epitaxial layer 4, and the respective emitter regions 6, 6a, 6b have been diffused into the corresponding base regions 5, 5a, 5b. Isolation regions 9, 10 have also been diffused into the epitaxial layer 4 so as to isolate the transistors from each other.

During the deposition of the epitaxial layer 4, the dopant or impurity previously diffused into the subcollector regions 2, 2a, 2b diffuses outwardly from the substrate 1 into the processing gas to which the wafer is subjected. The impurity then diffuses somewhat through the gas and then diffuses back into the substrate 1 and the forming epitaxial layer 4 in areas thereof exterior to the original peripheral outlines of the subcollector regions. This is called "autodoping." As a result, the subcollector regions, instead of being delineated by the windows in the subcollector diffusion mask, are provided with laterally extending portions as indicated at 7, 8 for subcollector regions 2, 3 and at 7b, 8b for subcollector region 2b, 3b.

It will be seen that if the adjacent transistors are not spaced sufficiently far apart from each other, the lateral extensions 7, 8 of one subcollector regions 2, 3 will contact the lateral extensions 7b, 8b of the adjacent subcollector region 2b, 3b. Should this occur, the collectors of adjacent transistors will be short-circuited resulting in a defective product. In order to obviate this condition, the transistors must be spaced apart a minimum predetermined distance, thereby limiting the circuit density and performance which may be achieved with integrated circuits made in accordance with the prior art methods. The requirement for a substantial spacing distance between adjacent transistors resulting in a limitation on the speed of operation of the circuitry and adversely affects the cost of manufacture.

DESCRIPTION OF THE PREFERRED EMBODIMENT

Figure 2:
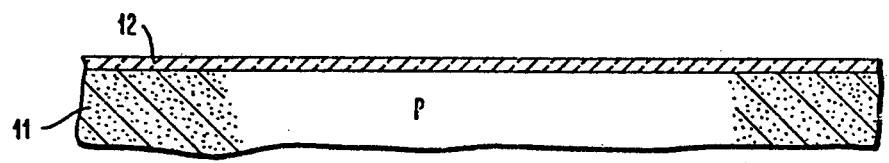
FIG. 2 is a sectional view showing the oxidation of the substrate in accordance with the method of the present invention.

In FIGS. 2 to 8 inclusive, there are shown the successive seps in the novel method of making an integrated circuit in accordance with the present invention. Referring first to FIG. 2, the reference numeral 11 designates the silicon wafer or substrate on the upper surface of which has been grown a layer 12 of silicon dioxide.

Figure 3:
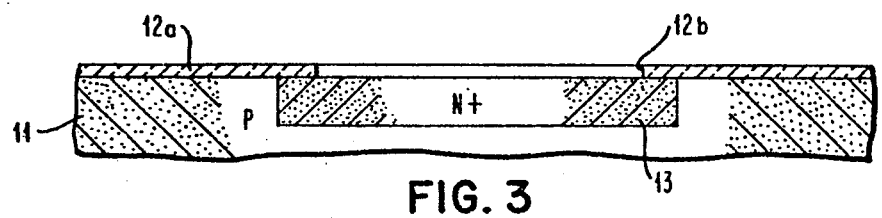
FIG. 3 is a sectional view showing the subcollector mask and subcollector diffusion in accordance with the method of the present invention.

In FIG. 3 an opening or window 12b has been etched through the silicon dioxide layer so as to form a subcollector mask 12a. A dopant or impurity such as arsenic or phosphorus has been diffused through the window 12b and into the substrate 11 to form an N+ subcollector region 13.

Figure 4:
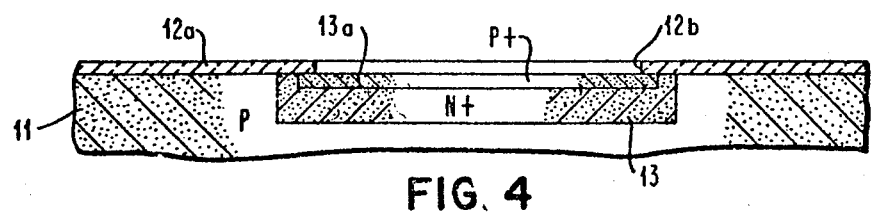
FIG. 4 is a sectional view showing the autodoping compensation diffusion in accordance with the method of the present invention.

In FIG. 4, there is shown the novel autodoping compensation diffusion. An impurity such as boron or gallium has been diffused through the same window 12b of the subcollector mask 12a into the shallow upper region 13a of the subcollector region 13. The region 13a is thus heavily doped to form a P+ layer superimposed over the N+ type subcollector region 13. It will be understood that if the subcollector region 13 is instead formed of a P type impurity such as boron or ballium, then the autodoping compensaion diffusion in region 14 will be of an N type impurity such as arsenic or phosphorus.

The proper impurity concentration and profile of the autodoping compensation diffusion into the region 13a are dependent upon many factors such as the type and concentration of the impurity in the subcollector region 13 and the respective times and temperatures of the subsequent epitaxial deposition, oxidation, and diffusion steps. These subsequent steps are described below in only general terms because the details of these subsequent steps form no part of the present invention. Upon the determination of these details the proper impurity concentration and profile of the autodoping compensation diffusion into the region 13a can then be empirically determined by trial and error so as to select that concentration and profile which will substantially eliminate the subcollector lateral extensions shown at 7, 8 and 7b, 8b in FIG. 1. The compensation diffusion should be shallow enough to be completely compensated by the principal impurity in the subcollector after all heat cycles, so as to obviate the formation of a final layer of opposite conductivity type when the entire process is completed.

Figure 5:
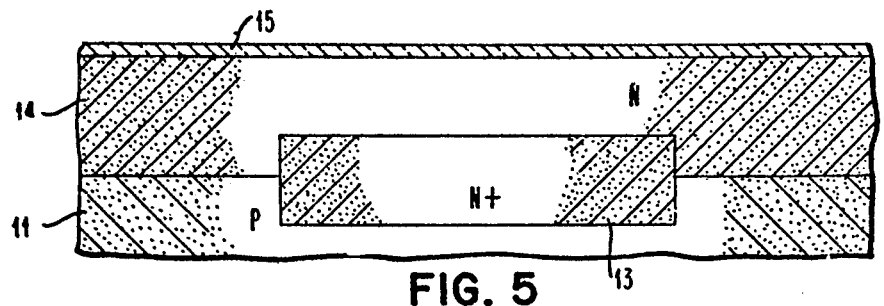
FIG. 5 is a sectional view showing the epitaxial deposition and reoxidation in accordance with the method of the present invention.

In FIG. 5 an epitaxial layer 14 has been deposited over the upper surface of the wafer 11 and a silicon dioxide layer 15 has been formed over the epitaxial layer 14 by reoxidation. During the deposition of the epitaxial layer 14 in accordance with the method of the present invention, the principal impurity in the subcollector region 13 will diffuse outwardly into the gas adjacent the upper surface of wafer 11, spread somewhat throughout the gas, and then diffuse back into the upper surface of wafer 11 and the lower surface of epitaxial layer 14 in the areas thereof exterior to the original peripheral outline of the subcollector region 13 in the same manner described above with respect to the prior art method shown in FIG. 1. However, in accordance with the present invention, the compensating impurity diffused into the region 13a also diffuses into the gas during the epitaxial deposition, spreads through the gas, and then diffuses back into said exterior areas so as to compensate for and counteract the effect of the principal impurity from the subcollector region 13. As a result, the lateral extensions 7, 8 and 7b, 8b shown in FIG. 1 are substantially eliminated in the method of the present invention. This enables adjacent transistors of the integrated circuit to be located substantially closer together than was heretofore possible in the prior art, thereby increasing the density and speed of the circuitry so as to improve the cost performance ratio of the apparatus.

Figure 6:
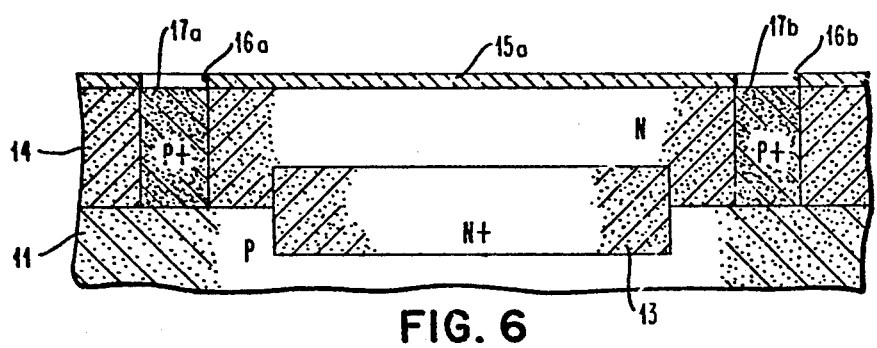
FIG. 6 is a sectional view showing the isolation mask and isolation diffusion in accordance with the method of the present invention.

In FIG. 6 an isolation mask 15a of silicon dioxide has been grown over the epitaxial layer 14 and is provided with isolation windows 16a, 16b through which is diffused an impurity forming the P+ isolation regions 17a, 17b extending downwardly through the epitaxial layer 14 to the upper surface of substrate 11.

Figure 7:
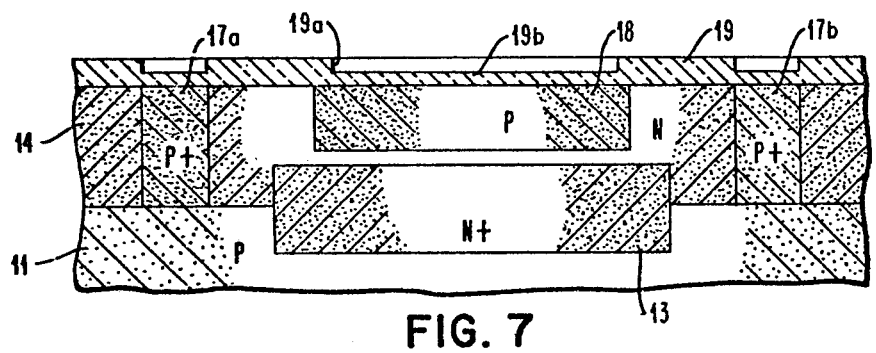
FIG. 7 is a sectional view showing the base mask, base diffusion and reoxidation in accordance with the method of the present invention.

In FIG. 7, a P type base region 18 has been formed through a base window 19a formed in a base diffusion mask 19. A reoxidation layer 19a has been formed over the base region 18 after the diffusion.

Figure 8:
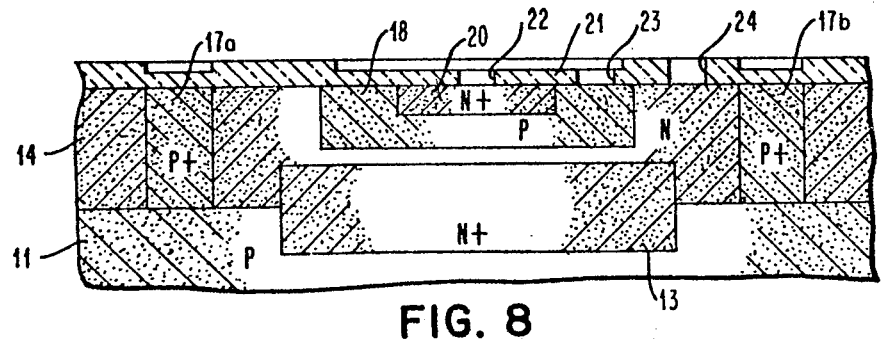
FIG. 8 is a sectional view showing the emitter mask, emitter diffusion and contact holes in accordance with the method of the present invention.

In FIG. 8 an N+ type emitter region 20 has been formed in the base region 18 diffusing a suitable impurity through a window in the emitter diffusion mask 21. There are also shown emitter contact hole 22, a base contact hole 23, and a collector contact hole 24.

It will be understood that although only one transistor has been shown in FIGS. 2 to 8 inclusive for simplicity and clarify in illustration, there are simultaneously formed in the wafer a plurality of integrated circuits each comprising a number of transistors and possibly other active and passive components such as diodes and resistors. After the emitter diffusion and contact opening steps shown in FIG. 8, the wafer may be metallized and then diced in the conventional manner to form a plurality of identical integrated circuits each comprising a number of components.

It should be noted that the compensating impurity diffused into the region 14 shown in FIG. 4 also compensates for the outdiffusion effect as well as the autodoping effect of the principal impurity diffused into the subcollector region 13. That is, during the reoxidation step of FIG. 5, and the diffusion and reoxidation steps of FIGS. 6 to 8, the principal impurity in the laterally extending regions 7, 8 in FIG. 1 will outdiffuse, that is, spread in upwardly, downwardly, and laterally outward directions. However, the compensating impurity originally diffused into the region 14 in FIG. 4 will also outdiffuse so as to compensate for and thereby counteract the effect of the principal impurity outdiffusion.

It is to be understood that the specific embodiment of the invention shown in the drawing and described above is merely illustrative of one of the many forms which the invention may take in practice without departing from the scope of the invention as delineated in the appended claims, and that the claims are to be construed as broadly as permitted by the prior art.

We claim:

1. In a method of making an integrated circuit including the steps of:
    diffusing a principal impurity of a predetermined conductivity type into a region of a semiconductor substrate, and
    depositing an epitaxial layer on said substrate,
    the improvement comprising the step of:
    diffusing an autodoping compensating impurity of an opposite conductivity type solely into said substrate region prior to said epitaxial deposition step,
    whereby the compensating impurity autodoping effect substantially compensates for and counteracts the principal impurity autodoping effect.

2. A method of making an integrated circuit as set forth in claim 1 wherein
    said principal impurity is an element selected from the group consisting of arsenic and phosphorus, and
    said compensating impurity is an element selected from the group consisting of boron and gallium.

3. A method of making an integrated circuit as set forth in claim 1 wherein
    said compensating impurity is an element selected from the group consisting of arsenic and phosphorus, and
    said principal impurity is an element selected from the group consisting of boron and gallium.

4. A method of making an integrated circuit as set forth in claim 1 and comprising the steps of:
    forming a base diffusion mask on said epitaxial layer and having a window therethrough,
    diffusing an impurity through said base diffusion mask window and into said epitaxial layer to form a base region therein,
    forming an emitter diffusion mask on said epitaxial layer and said base region and having a window therethrough, and
    diffusing an impurity through said emitter diffusion mask window and into said base region to form an emitter region therein,
    whereby during said mask forming and diffusion steps said principal and compensating impurities outdiffuse at respective rates so that the compensating impurity outdiffusion substantially compensates for and counteracts the principal impurity outdiffusion.

5. In a method of making an integrated circuit including the steps of
    diffusing a principal impurity of a predetermined conductivity type into a region of a semiconductor substrate, and
    depositing an epitaxial layer on said substrate by subjecting said substrate to a gas whereby an amount of said principal impurity diffuses from said substrate region into said gas and then into said epitaxial layer and said substrates in areas thereof exterior to the periphery of said region thereby resulting in an autodoping effect,
    the improvement comprising the steps of diffusing a compensating impurity of an opposite conductivity type solely into said substrate region prior to said epitaxial deposition step, and
    causing said compensating impurity to diffuse from said substrate region into said gas and then into said epitaxial layer and said substrate in said exterior areas thereof during said epitaxial growing step and thereby causing said compensating impurity to compensate for said principal impurity so as to counteract the autodoping effect of the latter.

6. A method of making an integrated circuit as set forth in claim 5 wherein
    said principal impurity is an element selected from the group consisting of arsenic aand phosphorus, and said compensating impurity is an element selected from the group consisting of boron and gallium.

7. A method of making an integrated circuit as set forth in claim 6 and comprising the steps of:

forming a base diffusion mask on said epitaxial layer and having an opening therethrough, diffusing an acceptor impurity through said base diffusion mask opening and into said epitaxial layer to form a base region therein, forming an emitter diffusion mask on said epitaxial layer and said base region and having an opening therethrough, and diffusing a donor impurity through said emitter diffusion mask opening and into said base region to form an emitter region therein, whereby during said mask forming and diffusion steps said principal and compensating impurities diffuse into said exterior areas at respective rates so that said compensating impurity approximately compensates for and counteracts the effect of said principal impurity in said exterior areas.

8. In a method of making an integrated circuit including the steps of diffusing a first impurity of a predetermined conductivity type into a plurality of regions of a semiconductor wafer, and growing an epitaxial layer on said wafer by subjecting said wafer to a gas whereby an amount of said first impurity diffuses from said wafer regions into said gas and then into said epitaxial layer and substrate in areas thereof exterior to the peripheries of said regions thereby resulting in an autodoping effect, the improvement comprising the steps of diffusing a second impurity of an opposite conductivity type solely into said wafer regions prior to said epitaxial growing step, and causing said second impurity to diffuse from said wafer regions into said gas and then into said exterior areas thereby causing said second impurity to compensate for said first impurity so as to counteract the autodoping effect of the latter.

9. A method of making an integrated circuit as set forth in claim 8 wherein said first impurity is an element selected from the group consisting of arsenic and phosphorus, and said second impurity is an element selected from the group consisting of boron and gallium.

10. A method of making an integrated circuit as set forth in claim 8 and comprising the steps of:

forming a base diffusion mask on said epitaxial layer, diffusing an impurity through said base diffusion mask and into said epitaxial layer to form base regions therein, forming an emitter diffusion mask on said epitaxial layer and said base regions, and diffusing an impurity through said emitter diffusion mask and into said base regions to form emitter regions to form emitter regions therein, whereby during said mask forming and diffusion steps said first and second impurities diffuse into said exterior areas at approximately equal rates so that said second impurity substantially compensates for and counteracts the effect of said first impurity.

11. A method of making an integrated circuit as set forth in claim 10 wherein said first impurity is phosphorus, and said second impurity is boron.

12. In a method of making an integrated circuit including the steps of forming on a wafer a diffusion mask having windows therethrough, diffusing a first impurity of a predetermined conductive type through said windows into regions of said wafer, removing said mask, and growing an epitaxial layer on said wafer by subjecting said wafer to a gas during which step an amount of said first impurity diffuses from said wafer regions into said gas and then into said epitaxial layer and said wafer in areas thereof exterior to the peripheries of said windows thereby resulting in an autodoping effect, the improvement comprising the steps of diffusing a second impurity of an opposite conductivity type through said windows into said wafer regions prior to said epitaxial growing step, and causing said second impurity to diffuse from said wafer regions into said gas and then into said epitaxial layer and wafer in said exterior areas thereof during said epitaxial growing step and thereby causing said second impurity to compensate for said first impurity so as to counteract the autodoping effect of the latter.

13. A method of making an integrated circuit as set forth in claim 12 wherein said first impurity is an element selected from the group consisting of arsenic and phosphorus, and said second impurity is an element selected from the group consisting of boron and gallium.

14. A method of making an integrated circuit as set forth in claim 12 wherein said second impurity is an element selected from the group consisting of arsenic and phosphorus, and said first impurity is an element selected from the group consisting of boron and gallium.

15. In a method of making an integrated circuit including the steps of forming on a semiconductor wafer a subcollector diffussion mask having subcollector windows therethrough, diffusing a first impurity of a predetermined conductivity type through said windows into regions of said wafer to form subcollector regions spaced from each other.

growing an epitaxial layer on said wafer by subjecting said substrate to a gas during which step and amount of said first impurity diffuses from said subcollector regions into said gas and then into said epitaxial layer and said wafer in areas thereof exterior to the peripheries of said subcollector regions thereby resulting in an autodoping effect, forming a base diffusion mask on said epitaxial layer and having base windows therethrough, diffusing an impurity through said base windows and into said epitaxial layer to form base regions therein, forming an emitter diffusion mask on said epitaxial layer and said base regions and having emitter windows therethrough, and diffusing an impurity through said emitter windows and into said base regions to form emitter regions therein, the improvement comprising the steps of diffusing to a relatively shallow depth a second impurity of a conductivity type opposite that of said first impurity solely into said subcollector regions prior to said epitaxial growing step, and causing said second impurity to diffuse into said exterior areas during said diffusion and mask forming steps and thereby causing said second impurity to compensate approximately for said first impurity so as to tend to counteract the autodoping and outdiffusion effects of the latter.

16. In a method of making an integrated circuit including the steps of:

diffusing a principal impurity of a predetermined conductivity type into a region of a semiconductor substrate throughout a predetermined surface area thereof and to a predetermined depth, and depositing an epitaxial layer on said substrate, the improvement comprising the step of:

diffusing an autodoping compensating impurity of an opposite conductivity type into said substrate region prior to said epitaxial deposition step and throughout a portion of said region having a surface area substantially coextensive with said predetermined surface area and having a depth substantially less than said predetermined depth whereby the compensating impurity autodoping effect substantially compensates for and counteracts the principal impurity autodoping effect.

17. A method of making an integrated circuit as set forth in claim 16 and comprising the steps of:

forming a base diffusion mask on said epitaxial layer and having a window therethrough, diffusing an impurity through said base diffusion mask window and into said epitaxial layer to form a base region therein, forming an emitter diffusion mask on said epitaxial layer and said base region and having a window therethrough, and diffusing an impurity through said emitter diffusion mask window and into said base region to form an emitter region therein.

18. A method of making an integrated circuit as recited in claim 17 and comprising heating said substrate during said mask forming and diffusion steps to cause said principal and compensating impurities to outdiffuse at respective rates whereby the compensating impurity outdiffusion substantially compensates for and counteracts the principal impurity outdiffusion.

19. In a method of making an integrated circuit including the steps of diffusing a principal impurity of a predetermined conductivity type into a region of a semiconductor substrate throughout a predetermined surface area thereof and to a predetermined depth, and depositing an epitaxial layer on said substrate by subjecting said substrate to a gas whereby an amount of said principal impurity diffuses from said substrate region into said gas and then into said epitaxial layer and said substrate in areas thereof exterior to the periphery of said region thereby resulting in an autodoping effect, the improvement comprising the steps of:

diffusing a compensating impurity of an opposite conductivity type into said substrate region prior to said epitaxial deposition step and throughout a portion of said region having a surface area substantially coextensive with said predetermined surface area and having a depth substantially less than said predetermined depth, and causing said compensating impurity to diffuse from said substrate region into said gas and then into said epitaxial layer and said substrate in said exterior areas thereof during said epitaxial growing step and thereby causing said compensating impurity to compensate for said principal impurity so as to counteract the autodoping effect of the latter.

20. A method of making an integrated circuit as set forth in claim 19 and comprising the steps of forming a base diffusion mask on said epitaxial layer and having an opening therethrough, diffusing an acceptor impurity through said base diffusion mask opening and into said epitaxial layer to form a base region therein, forming an emitter diffusion mask on said epitaxial layer and said base region and having an opening therethrough, and diffusing a donor impurity through said emitter diffusion mask opening and into said base region to form an emitter region therein.

21. A method of making an integrated circuit as recited in claim 20 and comprising heating said substrate during said mask forming and diffusion steps to cause said principal and compensating impurities to diffuse into said exterior areas at respective rates, whereby said compensating impurity approximately compensates for and counteracts the effect of said principal impurity in said exterior areas.

* * * * *